United States Patent [19]
Ogasawara

[11] Patent Number: 5,867,545
[45] Date of Patent: Feb. 2, 1999

[54] PHASE-LOCKED LOOP CIRCUIT

[75] Inventor: Yuuichi Ogasawara, Tokyo, Japan

[73] Assignee: Oki Electric Industry Co., Ltd., Tokyo, Japan

[21] Appl. No.: 794,467

[22] Filed: Feb. 4, 1997

[30] Foreign Application Priority Data

Mar. 22, 1996 [JP] Japan .................................. 8-066000

[51] Int. Cl.$^6$ .................................................. H03D 3/24
[52] U.S. Cl. .......................... 375/376; 331/25; 327/156
[58] Field of Search .................................. 375/376, 371;
331/25, 18, 14, 1 R, 1 A; 327/156, 159, 147, 150; 455/260

[56] References Cited

U.S. PATENT DOCUMENTS

| | | | |
|---|---|---|---|
| 5,184,350 | 2/1993 | Dara | 375/376 |
| 5,260,979 | 11/1993 | Parker et al. | 375/376 |
| 5,455,840 | 10/1995 | Nakauchi et al. | 375/371 |
| 5,483,204 | 1/1996 | Tanoi | 331/14 |
| 5,689,536 | 11/1997 | Iyota et al. | 375/376 |

*Primary Examiner*—Stephen Chin
*Assistant Examiner*—Betsy L. Deppe

[57] ABSTRACT

A phase-locked loop circuit, in which it takes a very short time until the internal clock becomes stable while switching external clocks, is provided with a phase comparison part, a voltage controlled oscillating part, plural dummy clock producing parts, a selection supply part and a monitor control part. The phase comparison part outputs a voltage corresponding to a phase difference between two inputted clocks. The voltage controlled oscillating part outputs an internal clock of a frequency corresponding to the voltage outputted from the phase comparison part. The plural dummy clock producing parts produce dummy clocks by dividing an internal clock outputted from the voltage control oscillating part, respectively, while resetting the respective dividing operations in synchronous with inputted external clocks. The selection supply part supplies an external clock selected among plural external clocks inputted into said plural dummy clock producing parts and a dummy clock outputted from a dummy clock producing part receiving the external clock to the phase comparison part. The monitor control part monitors the states of the plural external clock and controls the selection supply part in a manner that a normal external clock is inputted into the phase comparison part. Moreover, the monitor control part controls the dummy clock producing part which the normal external clock is inputted in a manner that a dummy clock is produced without the reset of the dividing operation.

6 Claims, 6 Drawing Sheets

PHASE-LOCKED LOOP CIRCUIT

BACKGROUND OF THE INVENTION

1. Field of the Invention

The present invention relates to a PLL (Phase-Locked Loop) circuit to synchronize an internal clock with an external clock from another apparatus, more particularly, relates to a PLL circuit capable of synchronizing an internal clock with one of plural external clocks for an electronic automatic exchange and the like.

2. Description of the Related Art

A PLL circuit produces a clock synchronizing with a clock from an external apparatus and including no jitter. For example, the PLL circuit is installed in an electronic automatic exchange to produce a communication system clock which synchronizes with an AMI clock (hereinafter, called external 64k+8k clock) to be a synthetic clock of a clock of a 64 kHz frequency (hereinafter, called external 64k clock) and a clock of a 8 kHz frequency (hereinafter, called external 8k clock) transmitted from a network such as the INS network.

Further, there are many cases in that a PLL circuit is fabricated to be capable of receiving clocks from plural supply sources in consideration of troubles at a network to be an external clock supply source.

FIG. 7 illustrates a sample of an above described conventional PLL circuit. As shown in FIG. 7, the conventional PLL circuit is provided with receiver circuits (RCV) $31_1$–$31_4$, an input monitor circuit 33, an input selection circuit 34, a phase comparison circuit 35, a low-pass filter (LPF) 36, a voltage controlled oscillator (VCO) 37, a 8k clock producing circuit 38 and a clock driver (CLKDRV) 39.

The RCVs $31_1$–$31_4$ separate the 64k+8K clock into the external 64k clock and the external 8k clock. The RCVs $31_1$–$31_4$ receive the 64k+8K clocks (IN1–IN4) from various clock supply sources, respectively. The external 64k clocks separated in the RCVs $31_1$–$31_4$ are supplied to the input monitor circuit 33, and the external 8k clocks are supplied to the input selection circuit 34.

The input monitor circuit 33 outputs one input selection signal indicating an IN in a normal status among four input selection signals corresponding to the IN1 through the IN4. The external 64k clocks separated in the RCVs $31_1$–$31_4$ are used in the input monitor circuit 23 for determining which input selection signal is outputted. That is, the input monitor circuit 33 grasps the status of each IN by monitoring always the status of each external 64k clock (the presence of each signal), and outputs the input selection signal indicating one IN in the normal status. Moreover, in outputting the input selection signal indicating an IN, when it is detected that this IN becomes defective, the input monitor circuit 33 specifies one IN among the other INs in normal status and outputs the input selection signal indicating the specified IN into the input selection circuit 34.

The input selection circuit 34, what is called a 4-1 selector, outputs the external 8k clock from the RCV 31 corresponding to the IN indicated by the input selection signal from the input monitor circuit 33 to the phase comparison circuit 35.

The phase comparison circuit 35, in addition to this external 8k clock, receives a 8k clock for phase comparison to be a signal from the 8k clock producing circuit 38 (details is described later). The phase comparison circuit 35 outputs a pulse signal having a width and a polarity corresponding to the phase difference between these two clocks into the LPF 36.

The LPF 36 integrates the inputted pulse signal to thereby convert the pulse signal to a voltage signal including no high frequency component. Then, the LPF 36 supplies the voltage signal to the VCO 37 as a frequency control voltage.

The VCO 37 produces a clock of a frequency corresponding to the frequency control voltage, and produces the clock of the frequency of 16.384 MHz when the frequency control voltage of "2.5" V is supplied. The clock produced in the VCO 37 (hereinafter, called 16M clock or VCO clock) is supplied to the 8k clock producing circuit 38 and the CLKDRV 39.

The 8k clock producing circuit 38 produces a 8k clock by dividing the 16M clock produced in the VCO 37, and outputs it. The output from the 8k clock producing circuit 38 is inputted into the phase comparison circuit 35 and the CLKDRV 39.

The CLKDRV 39 supplies the 8k clock from the 8k clock producing circuit 38 and the 16M clock from the VCO 37 to a system (not shown) such as a communication system.

That is, the PLL circuit shown in FIG. 7 is fabricated to adjust the frequency of the VCO clock in a manner that the phase difference between the 8k clock outputted from the 8k clock producing circuit 38 and the external 8k clock supplied to the phase comparison circuit 35 becomes "0".

This PLL circuit produces an 8k clock including no jitter and coinciding with the external 8k clock concerning a phase and a frequency, therefore, a satisfied communication can be obtained. Moreover, when a trouble occurs in the IN including that external 8k clock, the IN is switched automatically and an 8k clock synchronized with the switched IN is produced, so that the communication can be continued.

In the conventional PLL circuit, however, there are some case that a trouble occurs in a system or a communication between systems when the IN is switched.

That is, when the external 8k clock inputted into the phase comparison circuit 35 is switched as the result which a trouble occurs in an IN, usually the phase of the external 8k clock before switching (i.e. the 8k clock for phase comparison outputted from the 8k clock producing circuit at that time) does not coincide with the phase of the external 8k clock after switching, therefore, the frequency of the VCO clock is adjusted in a manner that the phase difference between the 8k clock outputted from the 8k clock producing circuit 38 and the external 8k clock after switching becomes "0".

For instance, there may be a maximum phase difference of 62.5 $\mu$s between the two external 8k clocks. Thus, in the worst case, immediately after changing over the clocks, there is the phase difference of 62.5 $\mu$s between the external 8k clock and the 8k clock for phase comparison inputted into the phase comparison circuit 35. Assuming that the frequency variation range of the VC0 37 in the PLL circuit shown in FIG. 7 is ±50 ppm of the oscillating frequency, namely, about ±19 Hz, it takes a time to establish the synchronization after occurring this worst case, as described later.

In this case, since the phase comparison circuit 35 outputs the maximum (or minimum) frequency control voltage, the VCO 37 outputs the VCO clock of 16.384819 MHz which is the maximum oscillating frequency. The time for one clock of this VCO clock is "1/16.384819" [MHz$^{-1}$=±sec], and the time for one clock of the VC0 clock at the central frequency is "1/16.384" [±sec]. Thus, the phase difference between the external 8k clock and the 8k clock for phase comparison becomes smaller $3.054586\times10^{-12}$ [sec] (1/16.384–1/16.384819 [±sec]) for one clock of the VCO clock. Therefore, it is necessary for the VC0 clock of at least 20461038 (=62.5×10$^{-6}$ [sec]/3.054586×10$^{-12}$ [sec]) until a synchronization is established. That is, it takes at least 1.24878 (=1/16.384819[MHz]×20461038)[sec] to establish the synchronization.

A PLL circuit is also known, in which the external 64k clock is inputted into the input selection circuit 33 and the external 8k clock is inputted into the input monitor circuit 23, namely, a PLL circuit which a synchronization is established with the 64k clock. When the 64k clock is used, the maximum phase difference becomes 7.8 μsec. Thus, when such a PLL circuit is fabricated with the above VCO, it takes at least 0.15609 [sec] to establish the synchronization in the worst case.

As above described, in the conventional PLL circuit, when the IN is switched, it takes a time corresponding to the phase difference between the external clocks before and after switching to establish the synchronization between the external clock and the clock for the phase comparison. Therefore, in the conventional PLL circuit, there are some cases that unstable clocks are supplied to a system for a relative long time during clock switching, as the result, there are some cases that a trouble occurs in a system or a communication between systems.

SUMMARY OF THE INVENTION

Accordingly, it is an object of the present invention to provide a PLL circuit which it takes a very short time until an internal clock becomes stable.

To achieve the above object, in a first aspect of the present invention, a PLL circuit is provided with a phase comparison part, a voltage controlled oscillating part, plural dummy clock producing parts, a selection supply part and a monitor control part. The phase comparison part outputs a voltage corresponding to a phase difference between two inputted clocks. The voltage controlled oscillating part outputs an internal clock having a frequency corresponding to a voltage outputted from the phase comparison part. The dummy clock producing part resets the dividing operation in synchronous with the inputted external clock and produces a dummy clock by frequency-dividing the internal clock outputted from the voltage controlled oscillating part.

The selection supply part supplies the external clock selected among plural external clocks inputted into the plural dummy clock producing part and the dummy clock outputted from the dummy clock producing part which that external clock is inputted to the phase comparison part. The monitor control part monitors states of the plural external clocks and controls the selection supply part in a manner that a normal external clock is inputted into the phase comparison part. Further, the monitor control part controls the dummy clock producing part which the normal external clock is inputted so as to produce a dummy clock without resetting the dividing operation.

That is, the PLL circuit of the first aspect is provided with plural dummy clock producing parts which may function as usual dividers. Each dummy clock producing part corresponding to an external clock which is not to be a synchronous object of the internal clock among these dummy clock producing parts is adjusted in a manner that a clock of little phase difference from the corresponding external clock can be outputted. Then, when there is a case that it is necessary to change the synchronous object of the internal clock, the dummy clock producing part corresponding to the external clock to be a synchronous object is controlled so as to operate as an usual divider, and the voltage controlled oscillating part is controlled in a manner that the phase of the clock produced by the dummy clock producing part is coincided with that of the internal clock.

As above described, this PLL circuit originally performs only a control for coinciding clocks of which phase difference is small while the external clock is switched. Therefore, as compared with the conventional PLL circuit, while the external clock is switched, the variation width of the frequency of the internal clock outputted from the voltage controlled oscillating part is small, and the variation time becomes shorter. As the result, according to this PLL circuit, a system can be structured in which no communication trouble occurs while the external clock is switched.

Moreover, to achieve the above object, in the second aspect of the present invention, a PLL circuit is provided with a phase comparison part, a voltage controlled oscillating part, an internal clock producing part, a predetermined number of dummy clock producing parts, a selection supply part and a monitor control part. The phase comparison part outputs a voltage corresponding to a phase difference between two inputted clocks. The voltage controlled oscillating part outputs a first internal clock of a frequency corresponding to a voltage outputted from the phase comparison part. The internal clock producing part produces a second internal clock by dividing the first internal clock outputted from the voltage control oscillating part. The dummy clock producing part resets the dividing operation in synchronous with the inputted external clock and produces a dummy clock by dividing the first internal clock outputted from the voltage controlled oscillating part.

The selection supply part supplies the predetermined number of the external clocks inputted into the predetermined number of the dummy clock producing parts and an external clock selected among external clocks except for the predetermined number of the external clocks to the phase comparison part. Additionally, the selection supply part, when a selected external clock is inputted into the dummy clock producing part, supplies the dummy clock outputted from the dummy clock producing part, and when the selected external clock is not inputted into the dummy clock producing part, supplies the second internal clock produced in the internal clock producing part. The monitor control part monitors states of the plural external clocks to be selected objects in the selection supply part and controls the selection supply part in a manner that a normal external clock is inputted into the phase comparison part. Further, the monitor control part, when the normal external clock is inputted into the dummy clock producing part, controls the dummy clock producing part so as to produce a dummy clock without resetting the dividing operation.

That is, in the PLL circuit of the second aspect, the same structure as the conventional PLL circuit is applied to one external clock, and the same structures as the PLL circuit of the first aspect are applied to the other external clocks. With the PLL circuit of the second aspect, as compared with the conventional PLL circuit, while the external clock is switched, the variation width of the frequency of the internal clock outputted from the voltage controlled oscillating part is small, and the variation time becomes shorter. Therefore, with this PLL circuit, a system, in which no communication trouble occurs while the external clock is switched, can be structured Additionally, the PLL circuit of the first or second aspect may be fabricated with a phase comparison part including a phase comparison circuit outputting a pulse signal of a level corresponding to the phase difference between two inputted clocks and a low-pass filter outputting a voltage of a level corresponding to the phase difference by integrating the pulse signal outputted from the phase comparison part.

Further, the PLL circuit of the first aspect may be added with plural receiver parts extracting a clock from a superimposed clock which two clocks having respective various frequencies are superimposed and outputting the clock as the external clock, and a clock driver part outputting the internal clock outputted from the voltage controlled oscillating part and the dummy clock inputted into the phase comparison part.

The PLL circuit may be also added with plural receiver parts extracting a clock from a superimposed clock which two clocks having respective various frequencies are superimposed and outputting the clock as the external clock, an internal clock producing part producing the second internal clock by dividing the internal clock outputted from the voltage controlled oscillating part, and a clock driver part outputting the internal clock outputted from the voltage controlled oscillating part and the second internal clock produced in the internal clock producing part.

Additionally, the PLL circuit of the second aspect may be added with plural receiver parts extracting a clock from a superimposed clock which two clocks having respective various clocks are superimposed and outputting the clock as the external clock, and a clock drive part outputting the first internal clock oscillated in the voltage controlled oscillating part and the second internal clock produced in the internal clock producing part.

BRIEF DESCRIPTION OF THE DRAWINGS

Other objects and advantages of the present invention will become apparent during the following discussion conjunction with the accompanying drawings, in which.

DETAILED DESCRIPTION OF THE PREFERRED EMBODIMENTS

Preferred embodiments of the present invention will now be described with reference to the accompanying drawings.

First Embodiment

Figure 1:
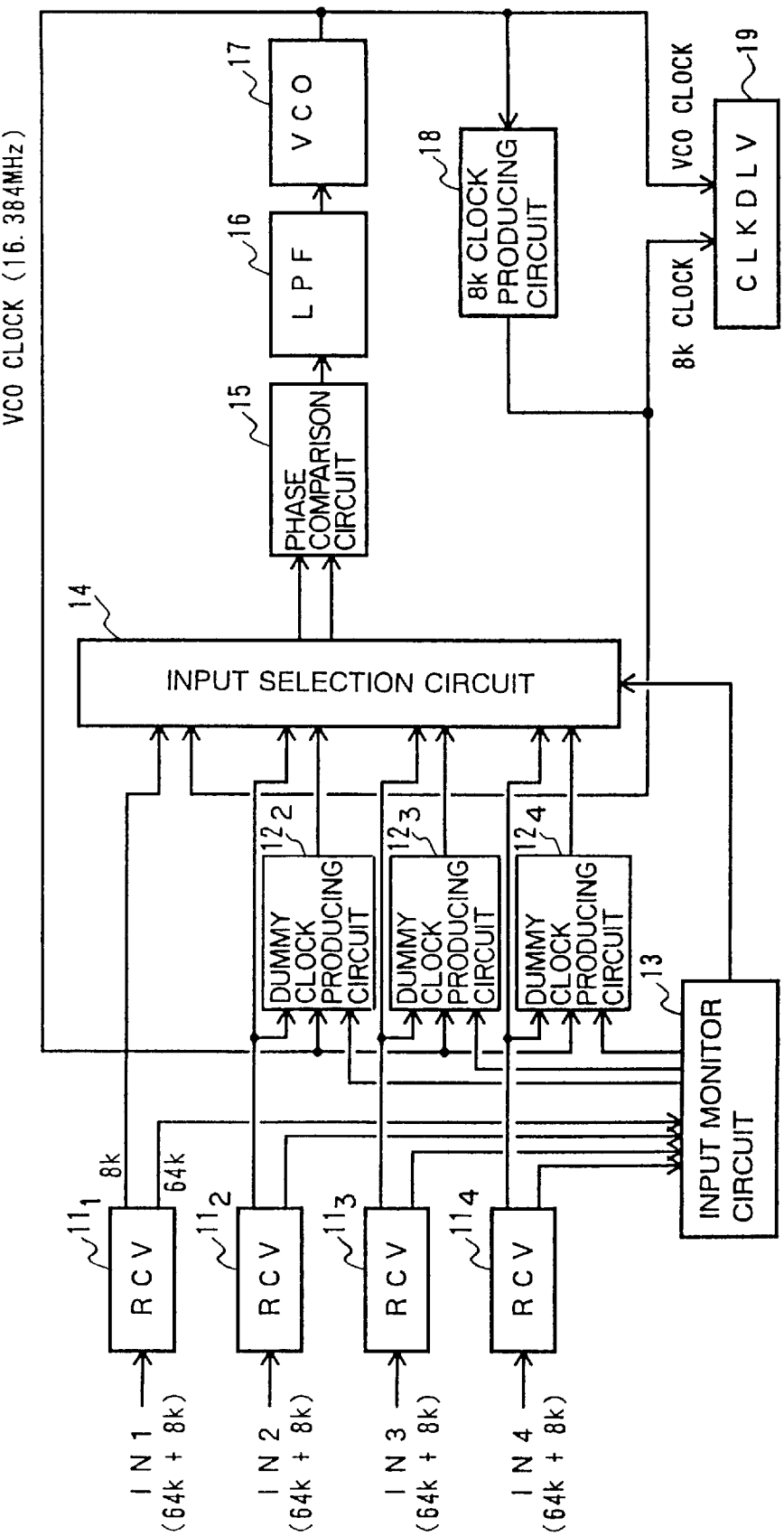
FIG. 1 is a structural block diagram illustrating a PLL circuit of the first embodiment.

FIG. 1 shows a structure of a PLL circuit according to the first embodiment of the present invention. As shown in FIG. 1, the PLL circuit of the first embodiment is provided with receiver circuits (RCV) $11_1$–$11_4$, dummy 8k clock producing circuits $12_2$–$12_4$, an input monitor circuit 13, an input selection circuit 14, a phase comparison circuit 15, a low-pass filter (LPF) 16, a voltage controlled oscillator (VCO) 17, a 8k clock producing circuit 18 and a clock driver (CLKDRV) 19.

Figure 7:
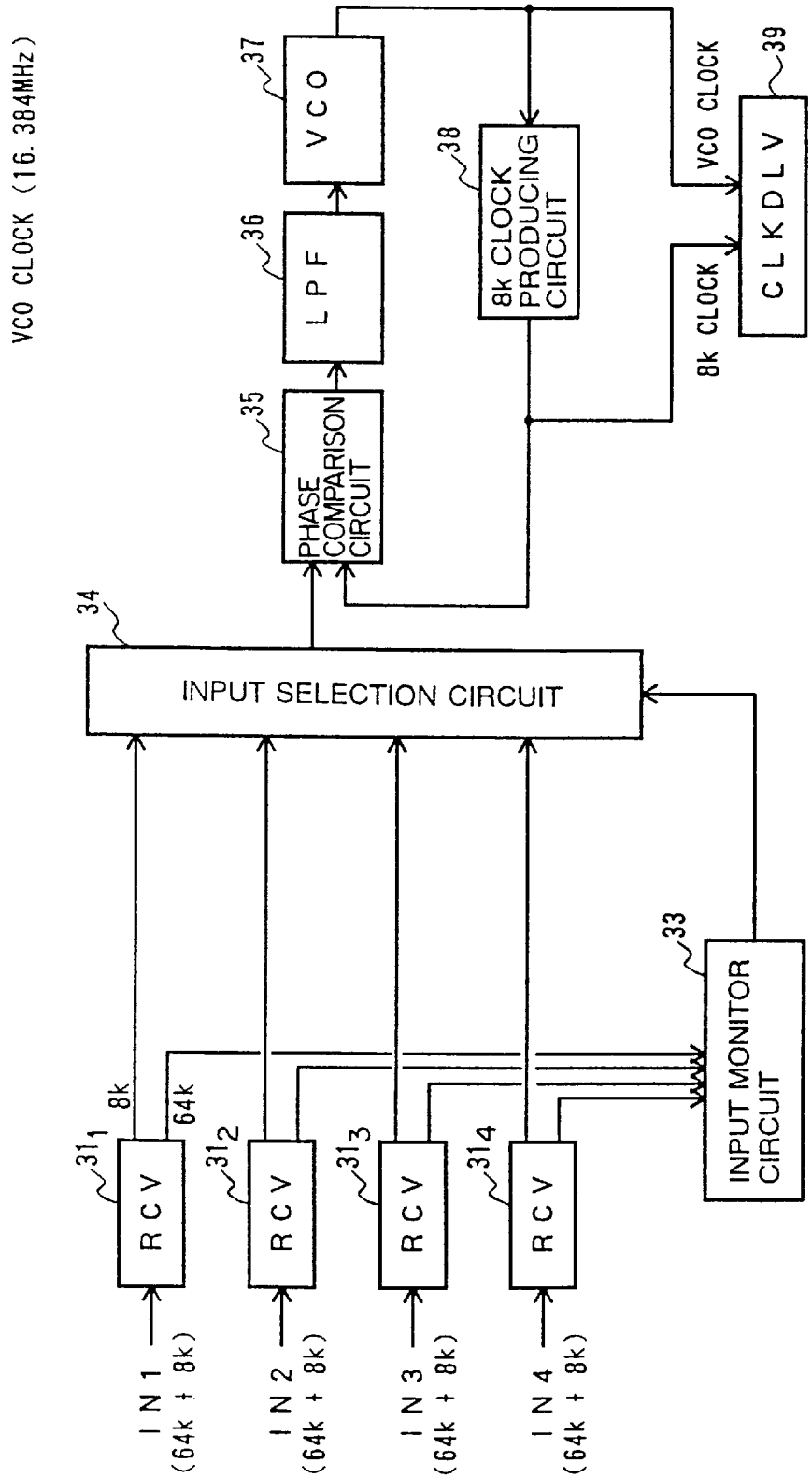

The RCVs $11_1$–$11_4$, the phase comparison circuit 15, the LPF 16, the VC0 17, the 8k clock producing circuit 18 and the CLKDRV 19 are similar to the respective corresponding circuits in the conventional PLL circuit explained in FIG. 7. Moreover, the connection aspect between the phase comparison circuit 15, the LPF 16, the VCO 17, the 8k clock producing circuit 18 and the CLKDRV 19 is similar to that in the conventional PLL circuit.

That is, the RCVs $11_1$–$11_4$ separate each IN1–IN4 to be a AMI clock including a clock of 64 kHz frequency and a clock of 8 kHz frequency into a clock of 64 kHz frequency and a clock of 8 kHz frequency. Note that the AMI clock is called 64k+8k clock hereinafter for convenience of the explanation and the clock of 64 kHz frequency and the clock of 8 kHz frequency separated by the RCV are called an external 64k clock and an external 8k clock, respectively.

Figure 2:
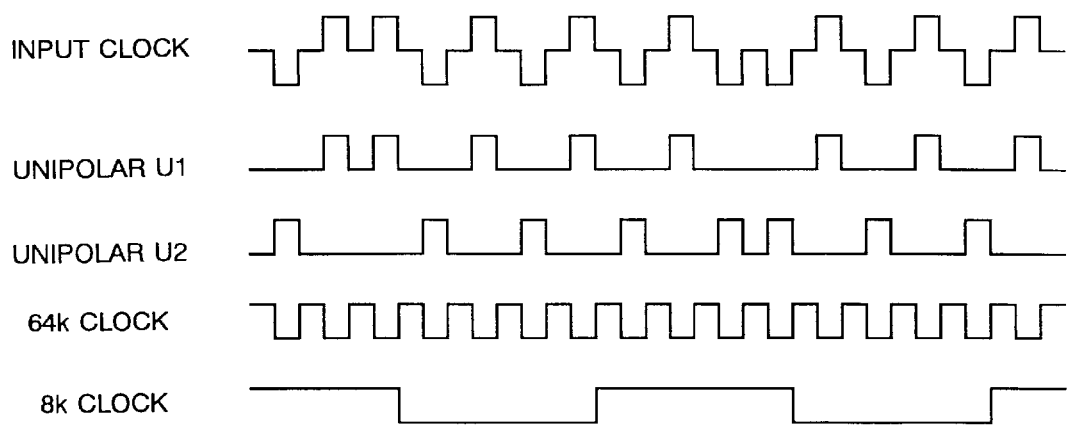
FIG. 2 is a clock time chart for explaining an operation of a receiver circuit (RCV) in a PLL circuit of the first embodiment.

Concretely, as shown in FIG. 2, unipolar signals U1 and U2 at the TTL level are produced from the 64k+8k clock in the RCV 11. Then, the two unipolar signals are added to produce the external 64k clock. Further, the external 8k clock is produced from the external 64k clock and the two unipolar signals.

Figure 3:
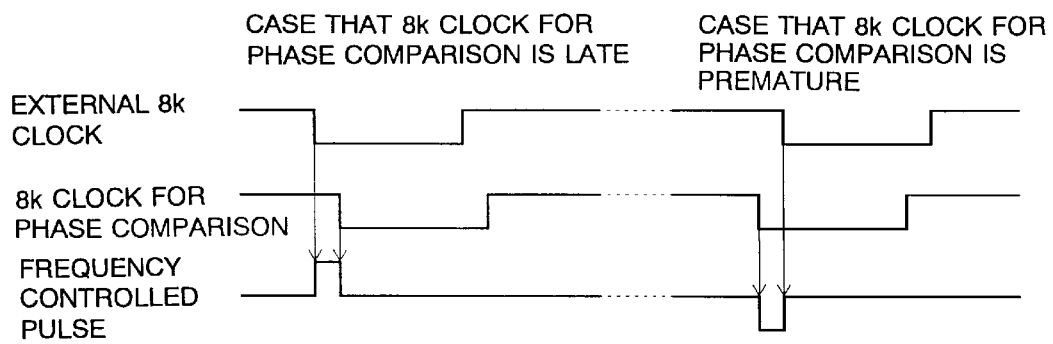
FIG. 3 is a clock time chart for explaining an operation of a phase comparison circuit in a PLL circuit of the first embodiment.

The phase comparison circuit 15 produces a frequency controlled pulse having a polarity and a pulse width corresponding to a phase difference between two inputted clocks. That is, the phase comparison circuit 15, as shown in FIG. 3, when the phase of the 8k clock for phase comparison is late compared with the external 8k clock, produces a positive polarity pulse having a pulse width corresponding to the late amount. The phase comparison circuit 15, when the phase of the 8k clock for phase comparison is premature compared with the external 8k clock, produces a negative polarity pulse having a pulse width corresponding to the premature amount.

The LPF 16 integrates the signal from the phase comparison circuit 15 to thereby produce a voltage signal of a level corresponding to the phase difference detected by the phase comparison circuit 15. Then, the produced voltage signal is supplied to the VC0 17 as a frequency controlled voltage.

The VC0 17 outputs a signal (VCO clock) of a frequency corresponding to the supplied frequency controlled voltage. In the first embodiment, an element is used, of which the central frequency is 16.384 MHz and the frequency variation range is about $\mu 50$ ppm of the central frequency, namely, about $\mu 819$ Hz.

The 8k clock producing circuit 18 frequency-divides the VCO clock from the VC0 17 to thereby produce and output the 8k clock. The CLKDRV 19 supplies the VCO clock from the VC0 17 and the 8k clock from the 8k producing circuit 18 to the system (not shown).

As above described, this PLL circuit has many same elements as the conventional PLL circuit. This PLL circuit, however, is provided with the input monitor circuit 13 and the input selection circuit 14 which operate differently from the input monitor circuit 33 and the input selection circuit 34, respectively, and is also provided with dummy clock producing circuits $12_2$–$12_4$. Thus, this PLL circuit operates differently from the conventional PLL circuit. The concrete explanations will be given of the operations and the structures of the input monitor circuit 13, the input selection circuit 14 and the dummy clock producing circuits 12.

The input monitor circuit 13 is a circuit which a function outputting three system mode selecting signals (reset inhibiting signals) is added to the input monitor circuit 33 used in the conventional PLL circuit.

That is, the input monitor circuit 13 outputs one input selecting signal indicating a INj (j is one of 1–4) in a normal state among four input selection signals corresponding to the IN1–IN4, respectively, as well as the input monitoring circuit 33. Moreover, the input monitor circuit 13 stores that state when it is detected that an INi (i≠j) has a trouble in outputting the input selection signal indicating the INj. The input monitor circuit 13 also stores that state when the INk (k≠j) having a trouble till then becomes normal in outputting the input selection signal corresponding to the INj. Further, the input monitor circuit 13 specifies one IN among normal INs at that time when it is detected that the INj has a trouble in outputting the input selection signal indicating the INj. Then, the input selection signal indicating the specified IN is outputted to the input selection circuit 14.

Additionally, this input monitor circuit 13, when there are plural normal input INs in operation, is fabricated so as to output the input selection signal indicating the IN of which the number is smallest among them. Moreover, the input monitor circuit 13, when it is detected that the INj has a trouble in outputting the input selection signal indicating the INj, is fabricated so as to specify an IN in the round robin form (1→2→3→4→1 . . . ).

In addition to the above functions, the input monitor circuit 13, when a newly specified IN is one of the INs 2–4, is provided with a function outputting a 'H' level signal (the reset inhibiting signal) to the dummy clock producing circuit 12 relative to the specified IN as a mode selection signal.

For example, the input monitor circuit 13 operates as follows when it is detected that the IN2 has a trouble in outputting the input selection signal indicating the IN2.

First, the input monitor circuit 13 determines whether the IN3 to be the next IN is normal or not. Then, when the IN3 is normal, the input monitor circuit 13 outputs the input selection signal indicating the IN3 to the input selection circuit 14 and outputs the reset inhibiting signal to the dummy clock producing circuit $12_3$.

On the contrary, when the IN3 is not normal, the input monitor circuit 13 determines whether the IN4 to be next to the IN3 is normal or not. Then, when the IN4 is normal, the input monitor circuit 13 outputs the input selection signal indicating the IN4 to the input selection circuit 14 and outputs the reset inhibiting signal to the dummy clock producing circuit $12_4$.

The dummy clock circuit $12_n$ (n=2–4) receives the VCO clock outputted from the VCO 17 and the external 8k clock separated by the RCV $11_n$, besides the mode selection signal (reset inhibiting signal). The dummy clock circuit $12_n$, when the reset inhibiting signal is inputted, outputs the clock of the frequency about 8 kHz–16 MHz by frequency-dividing the VCO clock. The dummy clock circuit $12_n$, however, when the reset inhibiting signal is not inputted, resets the dividing operation in synchronous with the external 8k clock and outputs the dummy clock of the frequency about 8 kHz.

The input selection circuit 14 includes two 4-1 selectors (not shown) controlled by the input selection signal alike. One 4-1 selector receives four external 8k clocks from the RCVs $11_1$–$11_4$ and the 4-1 selector supplies the external selection signal corresponding to the input selection signal to the phase comparison circuit 15. The other 4-1 selector receives the 8k clock produced in the 8k clock producing circuit 18 and the dummy 8k clocks produced in the dummy clock producing circuits $12_2$–$12_4$ and the 4-1 selector supplies a clock corresponding to the input selection signal to the phase comparison circuit 15 as a clock for phase comparison.

Figure 4:
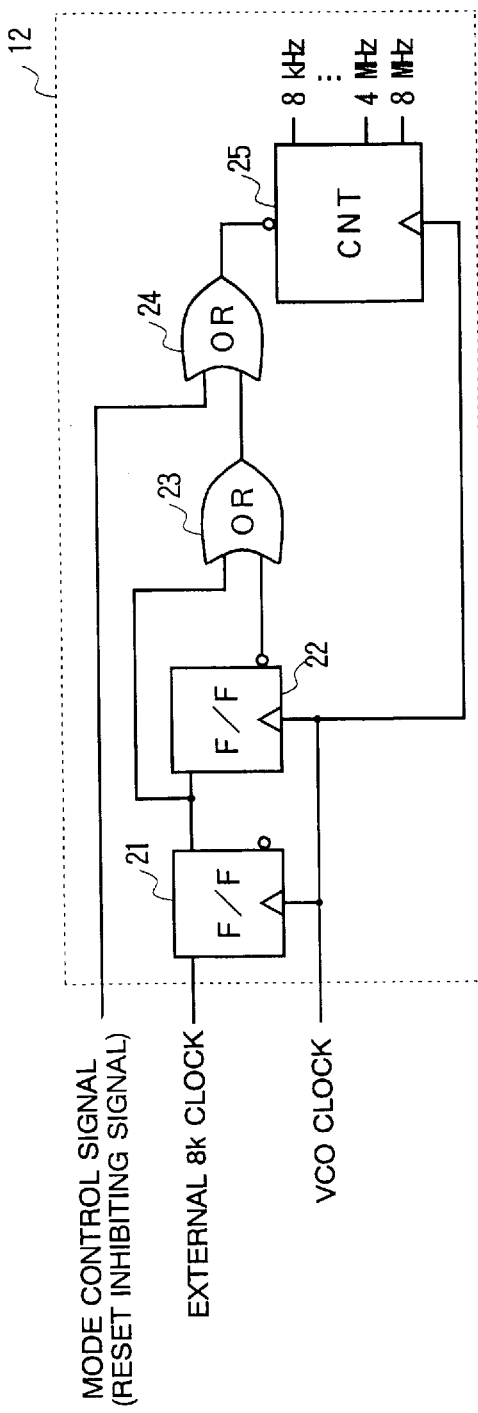
FIG. 4 is a circuit diagram illustrating a structure of a dummy clock producing circuit in a PLL circuit of the first embodiment.
Figure 5:
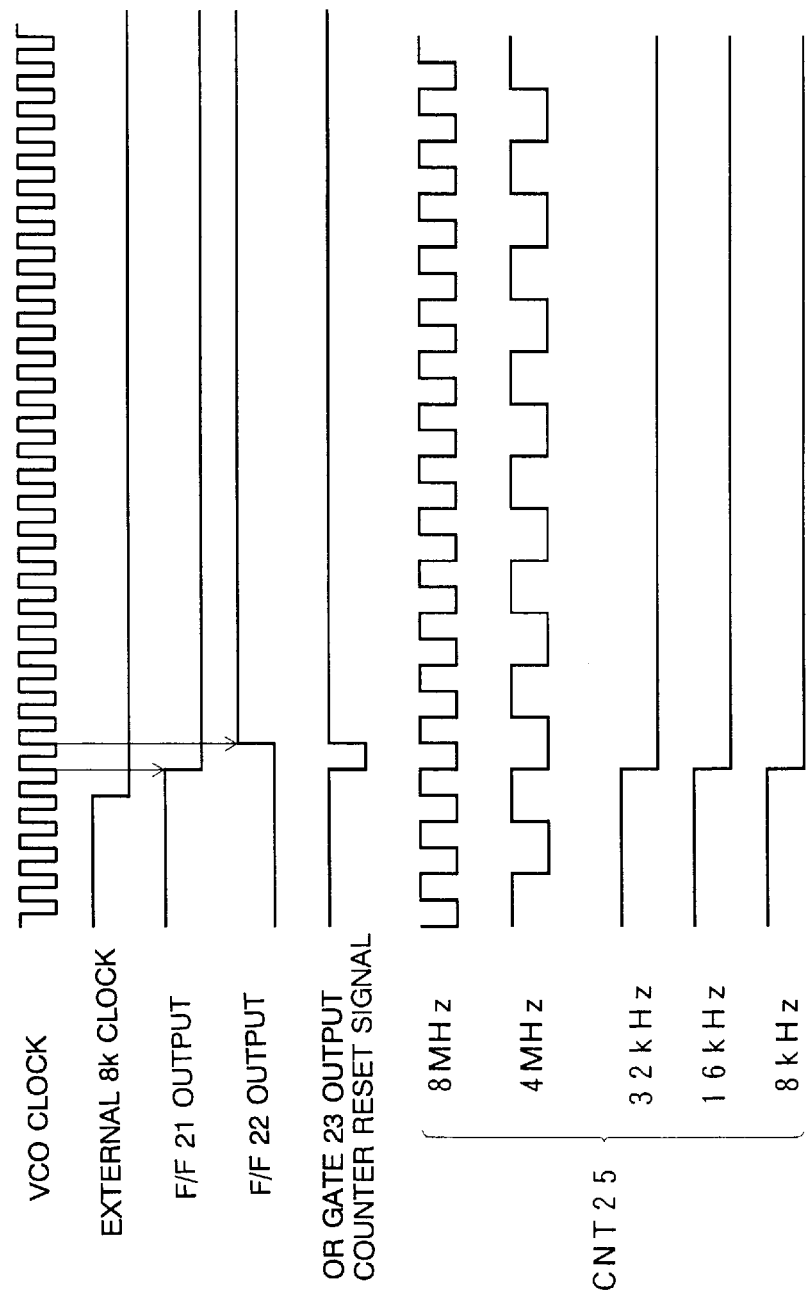
FIG. 5 is a clock time chart for explaining an operation of a dummy clock producing circuit in a PLL circuit of the first embodiment.

Referring to FIGS. 4 and 5, the explanation will be given of the structure and the operation of the dummy clock producing circuit 12 and the explanation will be given of the whole operation of the PLL circuit of the first embodiment. FIG. 4 is a circuit diagram of the dummy clock producing circuit 12, and FIG. 5 is a timing chart showing the operation of the dummy clock producing circuit 12.

As shown in FIG. 4, the dummy clock producing circuit 12 is provided flip-flops (F/F) 21, 22, two-input OR gates 23, 24 and a counter (CNT) 25. The VCO clock is inputted into the clock pulse input terminals of the F/F 21, the F/F 22 and the CNT 25. The external 8k clock is inputted into the input terminal of the F/F 21. The non-inversion output terminal of the F/F 21 is connected with the input terminal of the F/F 22 and one input terminal of the two-input OR gate 23. The other input terminal of the two-input OR gate 23 is connected with the inverted output terminal of F/F 22. The one input terminal of the two-input OR gate 24 receives the operational mode control signal (reset inhabiting signal), and the other input terminal receives the output from the two-input OR gate 23. Then, the output from the two-input OR gate 23 is inputted into the reset terminal of the CNT 25.

The CNT 25 is a frequency divider producing 8 MHz–8 kHz clocks which the VCO clock is divided by counting the VCO clock. The VCO 25, when the level of the signal inputted into the reset terminal changes from "H" to "L", resets the count operation. Moreover, the 8k clock producing circuit 18 is that the CNT 25 of which the reset terminal is released.

In the dummy clock producing circuit 12 as above structured, as shown in FIG. 5, the output terminal of the F/F 21 outputs a signal which the external 8k clock is latched at the leading timing of the VCO clock. The non-inversion output terminal of the F/F 22 outputs a signal which the output from the F/F 21 is latched at the trailing timing of the VCO clock and inverted. That is, the F/F 22 inverts the signal outputted from the F/F 21 and outputs the signal which one period of the VCO clock is delayed.

Thus, the two-input OR gate 23 which the outputs of the F/F 21 and the F/F 22 are inputted, when both inputs become "L" level, namely, immediately after that the external 8k clock becomes "L" level, outputs a pulse of "L" level. Then, the OR operational result of a signal including the pulse and a mode control signal is inputted into the reset terminal of the CNT 25.

As the result, when the mode control signal of "L" level is supplied to the dummy clock producing circuit 12 (when no reset inhibiting signal is supplied), the reset terminal of the CNT 25 receives directly the output of the two-input OR gate 23. In this case, therefore, the CNT 25 receives the output of the two-input OR gate 23 as a counter reset signal, and when this signal varies to the "L" level, the count value till then is reset and a count-up is started from "0". That is, the CNT 25, as shown in FIG. 5 as a model, produces an 8k clock (and 16k-8M clocks) suspectedly synchronized with the external 8k clock by resuming the dividing operation of the VCO clock whenever the two-input OR gate 23 outputs a pulse.

On the contrary, when the mode control signal of "H" level is supplied to the dummy clock producing circuit 12 (when a reset inhibiting signal is supplied), the signal of "H" level is supplied to the reset terminal of the CNT 25 independently of the level of the output from the two-input OR gate 23. Thus, in this case, the CNT 25 continues the dividing operation of the VCO clock (producing 8k-8M clocks) without resetting the count value.

As above explained with FIG. 1, in the PLL circuit of the first embodiment, when the IN1 is used, namely, at starting, the external 8k clock included in the IN and the 8k clock outputted from the 8k clock producing circuit 18 are inputted into the phase comparison circuit 15, and the 8k clock which is synchronized with the external 8k clock and of which the phase coincides with that of the external 8k clock is outputted from the CLKDRV 19.

Further, when a trouble occurs in the IN1, the external 8k clock included in the INm (m=2–4) and the 8k clock outputted not from the 8k clock producing circuit 18 but from the dummy clock producing circuit $12_m$ are inputted, and the control for coinciding phases of both clocks is started. That is, in this PLL circuit, the control for coinciding phases of the external 8k clock and the 8k clock outputted from the 8k clock producing circuit 18 is not applied to the IN2–IN4, but a control for synchronizing both clocks is performed.

Then, the dummy clock producing circuit $12_m$, when that is not selected, resets the dividing start timing of the VCO clock in synchronous with the external 8k clock, and when that is selected, the reset operation is stopped. Thus, in switching to the $IN_m$, the phase comparison circuit 15 receives two clocks of which the phase difference is very small (about one period of VCO clock). Thus, the phases of the two clocks inputted into the phase comparison circuit 15 are coincided without a large variation of the frequency of the VCO clock and at a very short time. That is, it takes a very short time to output the 8k clock of which the frequency varies. Thus, according to this PLL circuit, in switching an IN, a system which no communication trouble occurs can be structured.

Second Embodiment

As apparent from the above explained structure, in the PLL circuit of the first embodiment, when the IN is switched to the IN1, as well as the conventional PLL circuit, an unstable 8k clock is outputted from the CLKDRV 19 for a time corresponding to the phase difference between the 8k clock outputted from the 8k clock producing circuit 18 and the external 8k clock separated from the IN1 immediately before switching. The PLL circuit of the second embodiment is improved concerning this point.

Incidentally, though there are not many cases of the switching to the IN1, the IN1is used. For instance, in a case that an input trouble occurs in the IN1 and the IN to be used is switched to the IN2, when input troubles occur in the IN2, the IN3, the IN4 sequentially and the trouble in the IN1 is restored at that time, the IN1 is used again.

Figure 6:
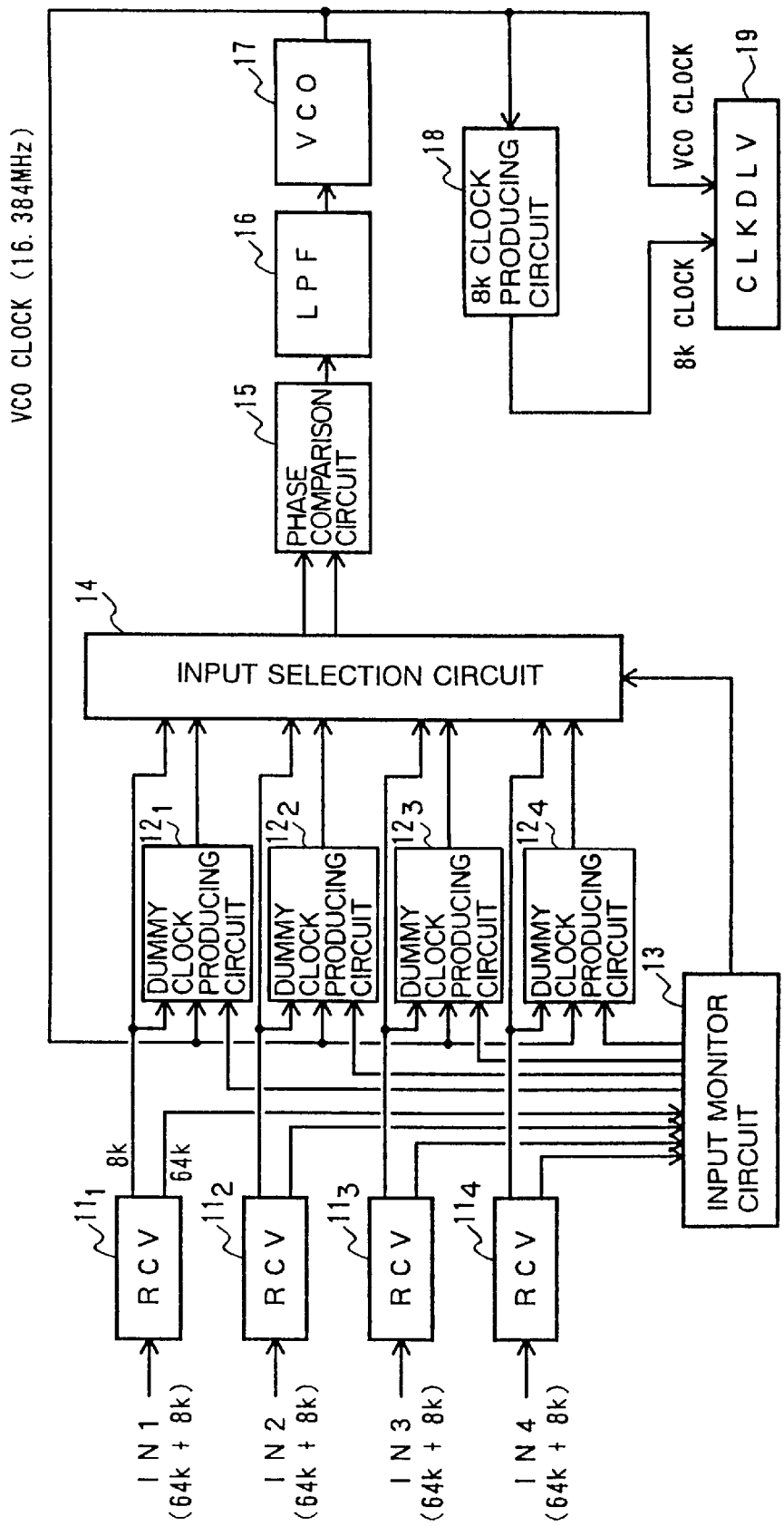
FIG. 6 is a structural block diagram illustrating a PLL circuit of the second embodiment; and, FIG. 7 is a structural block diagram illustrating a conventional PLL circuit.

FIG. 6 shows a structure of a PLL circuit of the second embodiment. As shown in FIG. 6, the PLL circuit of the second embodiment is that a dummy clock producing circuit $12_1$ is added to the PLL circuit of the first embodiment (FIG. 1) and the output of the 8k clock producing circuit 18 is supplied to only the CLKDRV 19. Moreover, the input monitor circuit 13 is that a function outputting a reset inhibiting signal (mode selection signal) to the dummy clock producing circuit $12_1$ is added to the input monitor circuit 13 in the first embodiment. The structure and the operation of the dummy clock producing circuit $12_1$ is similar to the dummy clock producing circuit $12_2$–$12_4$ explained with FIGS. 4, 5. The other circuits are similar to the circuits which the same numerals are applied in FIG. 1, respectively.

The explanation will be given of the operation of the PLL circuit in the second embodiment.

In the PLL circuit of the second embodiment, as well as the PLL circuit of the first embodiment, at starting operation, the IN1 is selected as a signal to establish a synchronization. At starting operation, the input monitor circuit 13 supplies the reset inhibiting signal to the dummy clock producing circuit $12_1$ from starting. Thus, the phase difference between the 8k clock outputted from the dummy clock producing circuit $12_1$ and the external 8k clock becomes a voluntary value.

Then, since these clocks are supplied to the phase comparison circuit 15 through the input selection circuit 14, the frequency of the VCO clock is controlled in a manner that the phase difference becomes "0". Moreover, the 8k clock producing circuit 18 produces the 8k clock by dividing the VCO clock independently of the dummy clock producing circuit $12_1$ and supplies the produced 8k clock to the CLKDRV 19.

That is, in the PLL circuit of the second embodiment, when the IN1 is selected, the 8k clock which is synchronous with the external 8k clock and of which the phase is not limited to coincide with that of the external 8k clock is also outputted from the CLKDRV 19.

Then, when a trouble occurs in the IN1 and, for example, the IN2 is selected, the input monitor circuit 13' starts to supply a reset inhibiting signal to the dummy clock producing circuit $12_2$ for the IN2 and stops supplying the reset inhibiting signal to the dummy clock producing circuit $12_1$. With this arrangement, when the trouble in the IN1 is restored, the producing of a dummy clock suspectedly synchronous with the external 8k clock included in the IN1 is started by the dummy clock producing circuit $12_1$.

As well as the PLL circuit of the first embodiment, the control is performed for coinciding the phases of the dummy clock previously prepared by the dummy clock producing circuit $12_2$ and the external 8k clock, and the 8k clock synchronized with the external 8k clock is outputted from the CLKDRV 19 in a very short time.

Then, when troubles occur in the IN2–IN4, the same control is repeated and the IN1 is selected again. In the case that the IN1 is selected again, since the dummy clock is produced by the dummy clock producing circuit $12_1$, as well as the switching to another IN, the 8k clock synchronized with the external 8k clock is outputted from the CLKDRV 19 in a very short time.

As above described, according to the PLL circuit of the second embodiment, though a switching to any IN is performed, a time that a clock supplied to a system is unstable can be very shorten.

Additionally, a PLL circuit may be fabricated in a manner that the clock inputted into the input selection circuit 14 as a clock for phase comparison is supplied to the system through the input selection circuit 14. In this case, however, since the clock supplied to the system is discontinuous, as shown in FIG. 6, it is desirable that the 8k clock producing circuit 18 is provided.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. A phase-locked loop circuit comprising:

a phase comparison part outputting a voltage corresponding to a phase difference between two inputted clocks;

a voltage controlled oscillating part outputting an internal clock of a frequency corresponding to the voltage outputted from the phase comparison part;

plural dummy clock producing parts, each of which produces a dummy clock by frequency-dividing the internal clock outputted from the voltage control oscillating part while resetting a dividing operation in synchronous with an inputted external clock;

a selection supply part supplying a selected external clock from among plural external clocks inputted into said plural dummy clock producing parts and said dummy clock outputted from said dummy clock producing part which receives the selected external clock to the phase comparison part; and, a monitor control part monitoring states of the plural external clocks, controlling the selection supply part in a manner that a normal external clock is inputted into the phase comparison part, and controlling the dummy clock producing part to which the normal external clock is inputted so that a dummy clock is produced without resetting the dividing operation.

2. A phase-locked loop circuit comprising:

a phase comparison part outputting a voltage corresponding to a phase difference between two inputted clocks;

a voltage controlled oscillating part outputting a first internal clock of a frequency corresponding to the voltage outputted from the phase comparison part;

an internal clock producing part producing a second internal clock by dividing the first internal clock outputted from the voltage control oscillating part;

a predetermined number of dummy clock producing parts, each of which produces a dummy clock by frequency-dividing the first internal clock outputted from the voltage control oscillating part while resetting a dividing operation in synchronous with an inputted external clock;

a selection supply part supplying a selected external clock from among external clocks to the phase comparison part and supplying, when the selected external clock is inputted to a dummy clock producing part, a dummy clock outputted from the dummy clock producing part to the phase comparison part and when the selected external clock is not inputted to the dummy clock producing part, the second internal clock produced in the internal clock producing part to the phase comparison part; and, a monitor control part monitoring states of plural external clocks to be subjects selected in the selection supply part, controlling the selection supply circuit in a manner that a normal external clock is inputted into the phase comparison part, and when the normal external clock is inputted into a dummy clock producing part, controlling the dummy clock producing part in a manner that a dummy clock is produced without resetting the dividing operation.

3. A phase-locked loop circuit according to claim 1, wherein:

said phase comparison part includes:

a phase comparison circuit outputting a pulse signal of a level corresponding to the phase difference between the two inputted clocks; and a low-pass filter outputting a voltage of a level corresponding to the phase difference by integrating the pulse signal outputted from the phase comparison circuit.

4. A phase-locked loop circuit according to claim 1, further comprising;

plural receiver parts, each of which extracts one clock from a superimposed clock which two clocks of different frequencies are superimposed and outputs as an external clock;

an internal clock producing part producing a second internal clock by dividing the internal clock outputted from the voltage controlled oscillating part; and, a clock drive part outputting the internal clock outputted from the voltage controlled oscillating part and the second internal clock.

5. A phase-locked loop circuit according to claim 2, further comprising;

plural receiver parts, each of which extracts one clock from a superimposed clock which two clocks of different frequencies are superimposed and outputs as an external clock; and, a clock drive part outputting the first internal clock and the second internal clock.

6. A phase-locked loop circuit according to claim 2, wherein:

said phase comparison part includes:

a phase comparison circuit outputting a pulse signal of a level corresponding to the phase difference between the two inputted clocks; and a low-pass filter outputting a voltage of a level responding to the phase difference by integrating the pulse signal outputted from the phase comparison circuit.

* * * * *